United States Patent
Tanabe

(10) Patent No.: US 8,440,373 B2
(45) Date of Patent: May 14, 2013

(54) MASK BLANK SUBSTRATE, MASK BLANK, PHOTOMASK, AND METHODS OF MANUFACTURING THE SAME

(75) Inventor: Masaru Tanabe, Tokyo (JP)

(73) Assignee: Hoya Corporation, Tokyo (JP)

( * ) Notice: Subject to any disclaimer, the term of this patent is extended or adjusted under 35 U.S.C. 154(b) by 0 days.

(21) Appl. No.: 13/241,691

(22) Filed: Sep. 23, 2011

(65) Prior Publication Data

US 2012/0015286 A1   Jan. 19, 2012

Related U.S. Application Data

(62) Division of application No. 12/536,966, filed on Aug. 6, 2009, now Pat. No. 8,048,593.

(30) Foreign Application Priority Data

Aug. 7, 2008 (JP) ................ 2008-204164

(51) Int. Cl.
*G03F 1/22* (2012.01)
(52) U.S. Cl.
USPC .................................................. 430/5
(58) Field of Classification Search ......... 430/5, 311, 430/312, 313, 394; 428/428, 430
See application file for complete search history.

(56) References Cited

U.S. PATENT DOCUMENTS

| | | | |
|---|---|---|---|
| 8,007,961 B2 * | 8/2011 | Tanabe | 430/5 |
| 8,048,593 B2 * | 11/2011 | Tanabe | 430/5 |
| 2005/0019676 A1 | 1/2005 | Nakatsu et al. | |
| 2006/0068300 A1 | 3/2006 | Tanabe et al. | |
| 2006/0223224 A1 | 10/2006 | Akagawa | |
| 2010/0081067 A1 | 4/2010 | Tanabe | |

FOREIGN PATENT DOCUMENTS

| | | |
|---|---|---|
| JP | 2003-050458 A | 2/2003 |
| JP | 2005-043830 A | 2/2005 |

OTHER PUBLICATIONS

Japanese Office Action dated Apr. 17, 2011 in corresponding Japanese Patent Application No. 2008-204164.

* cited by examiner

*Primary Examiner* — Stephen Rosasco
(74) *Attorney, Agent, or Firm* — Sughrue Mion, PLLC

(57) ABSTRACT

A mask blank substrate for a photomask is chucked on a mask stage of an exposure apparatus. A main surface, on the side where a thin film for a transfer pattern is to be formed, of the mask blank substrate has a flatness of 0.3 μm or less in a 142 mm square area including its central portion and has a convex shape being relatively high at its central portion and relatively low at its peripheral portion. The difference upon fitting, to the main surface of the mask blank substrate, a virtual reference main surface, having a spherical shape in a 132 mm square area, of a virtual reference substrate is 40 nm or less.

18 Claims, 11 Drawing Sheets

MASK BLANK SUBSTRATE, MASK BLANK, PHOTOMASK, AND METHODS OF MANUFACTURING THE SAME

CROSS REFERENCE TO RELATED APPLICATIONS

This application is a Divisional application of U.S. application Ser. No. 12/536,966 filed Aug. 6, 2009, which is based on and claims priority under 35 U.S.C. §119 to Japanese Patent Application No. 2008-204164, filed on Aug. 7, 2008, the disclosure of which is incorporated herein in its entirety by reference.

TECHNICAL FIELD

This invention relates to a mask blank substrate and a mask blank for a photomask for use in a photolithography process.

BACKGROUND ART

In a photolithography process of semiconductor manufacturing processes, a photomask is used. Following the miniaturization of semiconductor devices, a demand for miniaturization in this photolithography process has been increasing. Particularly, an increase in NA of an exposure apparatus using ArF exposure light (193 nm) has proceeded for adaptation to the miniaturization and a further increase in NA is proceeding following the introduction of the immersion exposure technique. For adaptation to the demand for the miniaturization and the increase in NA described above, it is required to enhance the flatness of a photomask. That is, in view of the fact that the allowable amount of position offset of a transfer pattern due to the flatness has been reduced following the reduction in pattern line width and that the focus latitude in the photolithography process has been reduced following the increase in NA, the flatness of main surfaces of a mask substrate, particularly the main surface on the side where a pattern is to be formed (hereinafter, the main surface on this side will be referred to simply as a "main surface" or a "substrate main surface"), is becoming more important.

On the other hand, when the photomask is chucked on a mask stage of an exposure apparatus by a vacuum chuck, it may happen that the photomask is largely deformed upon chucking due to the affinity with the mask stage or the vacuum chuck. That is, since the product management is conducted in terms of the flatness of the photomask before chucking, it may happen that even if the shape of the main surface thereof before chucking has high flatness, when the photomask is chucked on the mask stage of the exposure apparatus, it is deformed to significantly degrade the flatness thereof depending on the affinity with the mask stage or the vacuum chuck. This tendency is outstanding particularly in the case of a substrate that tends to be distorted due to low symmetry of the shape of its main surface. Thus, it is becoming necessary to consider the flatness of the photomask when it is chucked by the vacuum chuck. There has been proposed a method of selecting a mask substrate having excellent flatness after chucking on a mask stage of an exposure apparatus (see JP-A-2003-50458 (Patent Document 1)).

DISCLOSURE OF THE INVENTION

According to the conventional method, however, for each of mask substrates (mask blank substrates), it is necessary to obtain information indicating the surface shape of a main surface and information indicating the flatness of a main surface before and after chucking on a mask stage of an exposure apparatus or to obtain, based on the flatness of a main surface and the structure of a mask chuck, information indicating the flatness of the main surface by simulation when the mask substrate is set in an exposure apparatus. Therefore, conventionally, it takes much time and labor to select a mask substrate having excellent flatness after chucking on the mask stage of the exposure apparatus. Further, the structure for chucking a mask substrate on a mask stage differs depending on an exposure apparatus and thus it is necessary to select a mask substrate per exposure apparatus.

Conventionally, use is made of a technique of aiming at finishing substrate main surfaces to have higher flatness in a substrate polishing process, selecting substrates polished to high flatness from among polished substrates, and extracting those substrates by simulation that match an exposure apparatus to be used. However, when the substrates are polished so as to have high flatness by the use of a double-side polishing machine adapted to simultaneously polish a plurality of substrates, the number of substrates reaching a target flatness is small among the simultaneously polished substrates and thus the yield of substrate production is low, which has been a problem. Further, as described above, the substrate polished to high flatness is not necessarily fit for the exposure apparatus to be used and thus the yield of substrate production is significantly reduced, which has been a problem.

This invention has been made in view of these circumstances and has an object to provide a mask blank substrate, a mask blank, and a photomask that do not require a simulation for the flatness of a mask substrate after chucking on a mask stage of an exposure apparatus and that can realize a desired flatness after chucking regardless of the chuck structure of an exposure apparatus.

According to this invention, there is provided a mask blank substrate for a photomask to be chucked on a mask stage of an exposure apparatus, wherein a main surface, on a side where a thin film for a transfer pattern is to be formed, of the mask blank substrate has a flatness of 0.3 μm or less in a 142 mm square area including its central portion and has a convex shape being relatively high at its central portion and relatively low at its peripheral portion, and a difference upon fitting, to the main surface, a virtual reference main surface, having a spherical shape in a 132 mm square area, of a virtual reference substrate is 40 nm or less.

In the mask blank substrate according to this invention, the virtual reference main surface preferably has a flatness of 0.2 μm or less in the 132 mm square area.

A mask blank according to this invention comprises the aforementioned mask blank substrate and a light-shielding film formed on the main surface of the mask blank substrate.

In the mask blank according to this invention, the light-shielding film is preferably made of a material mainly composed of chromium or a material mainly composed of molybdenum silicide.

A photomask according to this invention has a transfer pattern formed by the light-shielding film of the aforementioned mask blank.

According to this invention, there is provided a mask blank substrate manufacturing method comprising the steps of:

polishing a main surface, on a side where a thin film is to be formed, of a substrate to have a flatness of 0.3 μm or less in a 142 mm square area including its central portion;

measuring a surface shape of the main surface of the substrate in a 132 mm square area thereof, performing fitting between the measured surface shape of the substrate and a virtual reference main surface of a virtual reference substrate, and selecting as a mask blank substrate the substrate if a difference therebetween is 40 nm or less.

A mask blank manufacturing method according to this invention comprises a step of forming a light-shielding film on a main surface, on a side where a thin film is to be formed, of a mask blank substrate obtained by the aforementioned method.

A photomask manufacturing method according to this invention comprises a step of forming a transfer pattern in a light-shielding film of a mask blank obtained by the aforementioned method.

For a mask blank substrate of this invention, a selection is made, in advance, of a virtual reference substrate in which the shape of a virtual reference main surface is a convex shape being relatively high at its central portion and relatively low at its peripheral portion and is a spherical shape in a 132 mm square area of the virtual reference main surface, i.e. the substrate having the ideal main surface shape. Then, fitting is performed with respect to the virtual reference main surface in a 132 mm square area, including a central portion, of a main surface, on the side where a thin film is to be formed, of an actually manufactured substrate. If the difference therebetween is 40 nm or less and the flatness in a 142 mm square area, including the central portion, of the main surface of the actually manufactured substrate is 0.3 μm or less, the actually manufactured substrate is judged to be a passed mask blank substrate. Therefore, it is not necessary to simulate the flatness of a mask substrate after chucking it on a mask stage of an exposure apparatus.

Polishing accuracy required when manufacturing the mask blank substrate is relaxed as compared with that required when manufacturing a substrate with very high flatness and, further, even a substrate that originally could not satisfy very high flatness can be shipped as a passed product that can fabricate a photomask adapted to exhibit sufficient transfer performance in a predetermined exposure apparatus. Thus, it is possible to significantly improve the yield. Much time is required for simulating manufactured substrates one by one, but in the case of this invention, it is only required to carry out fitting of manufactured substrates to the virtual reference main surface of the virtual reference substrate determined in advance and thus the time required for judging the substrates can be significantly reduced. Further, by setting the virtual reference main surface of the virtual reference substrate that can be commonly used for various chuck-type exposure apparatuses, it is possible to provide a mask blank substrate that can fabricate a photomask adapted to exhibit predetermined transfer performance regardless of the chuck structure of an exposure apparatus.

DETAILED DESCRIPTION OF THE INVENTION

With respect to a mask blank substrate of this invention, rather than attaching importance to manufacturing a substrate having a main surface with very high flatness when it is not chucked on a mask stage, importance is attached to causing a main surface, where a transfer pattern of a photomask is to be formed, of a substrate, when it is chucked on a mask stage, to be flat enough to exhibit sufficient transfer performance in transfer of the transfer pattern by an exposure apparatus.

As a result of analyzing a change in shape of a substrate when a photomask is chucked on a mask stage of an exposure apparatus, the following have been found. Normally, when chucking a photomask on a mask stage of an exposure apparatus, portions of a main surface on two opposite end face sides of the photomask are used as chuck areas.

Figure 1:
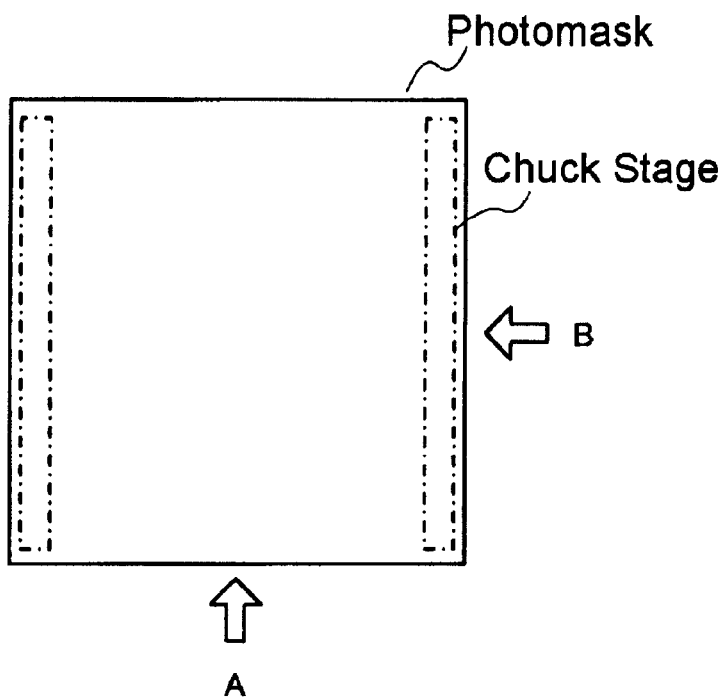
FIG. 1 is a plan view, as seen in a direction of a substrate main surface, when a photomask is placed on chuck stages of an exposure apparatus.
Figure 2A:
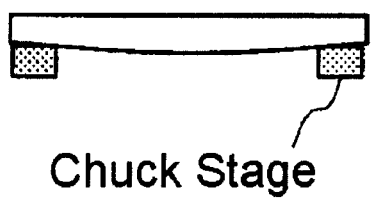
FIG. 2A is a diagram showing the shape of the photomask before chucking it on the chuck stages and is a side view as seen in a direction A indicated in FIG. 1.
Figure 2B:
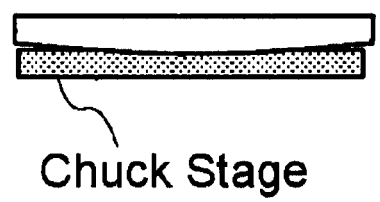
FIG. 2B is a diagram showing the shape of the photomask before chucking it on the chuck stages and is a side view as seen in a direction B indicated in FIG. 1.

Generally, a substrate with a main surface polished by a polishing machine tends to have, on the nature of the polishing, a sectional shape in which, basically, the center is high and the end face sides are low, and thus a photomask fabricated from the substrate having such a main surface shape also has the same surface shape and is chucked on a mask stage of an exposure apparatus. FIG. 1 is a plan view when a photomask having such a shape is placed on chuck stages (portions, with which a surface of a photomask is brought into direct contact so as to be chucked, of a mask stage) of an exposure apparatus. FIG. 2A is a side view, as seen in a direction A (chuck stage short-side direction) indicated in FIG. 1, showing a state before the photomask is chucked on the chuck stages. FIG. 2B is a side view, as seen in a direction B (chuck stage long-side direction) indicated in FIG. 1, also showing the state before the photomask is chucked on the chuck stages. As seen from FIG. 2A, both end face sides of the photomask are warped up on the chuck stage short-side sides due to the surface shape of the photomask. As seen from FIG. 2B, both end face sides of the photomask are warped up on the chuck stage long-side sides due to the surface shape of the photomask.

Figure 3A:
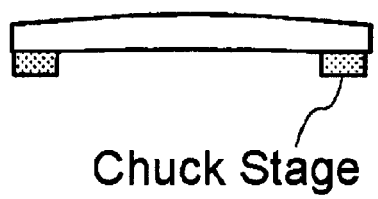
FIG. 3A is a diagram showing the shape of the photomask after chucking it on the chuck stages and is a side view as seen in the direction A indicated in FIG. 1.
Figure 3B:
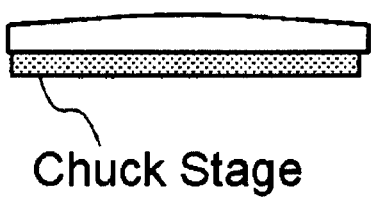
FIG. 3B is a diagram showing the shape of the photomask after chucking it on the chuck stages and is a side view as seen in the direction B indicated in FIG. 1.

In such a placed state, when the photomask is chucked on the chuck stages, as shown in FIGS. 3A and 3B, the warped-up four end face sides of the photomask are pulled by suction and thus a force having a function of deforming the photomask upward into quadratic components from the four end face directions is applied to the substrate. That is, a force adapted to deform a main surface of a substrate into a quadratic surface (spherical shape) so as to be convex upward toward the center from chuck areas on the four end face sides tends to be applied to the substrate.

Figure 4A:
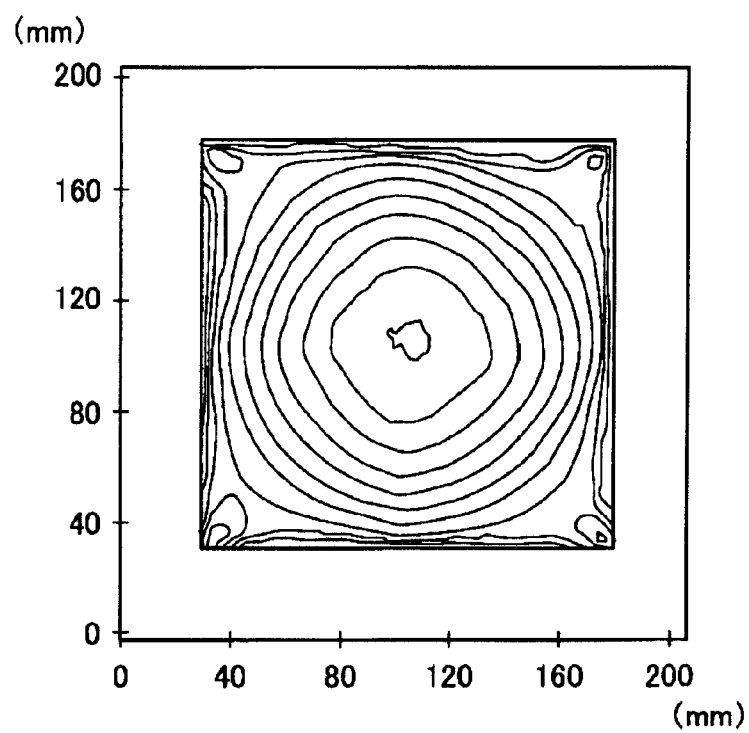
FIG. 4A is a contour diagram showing the shape of a main surface of a substrate to which this invention is applied, wherein the shape of the main surface of the substrate before chucking on chuck stages of an exposure apparatus is illustrated.
Figure 4B:
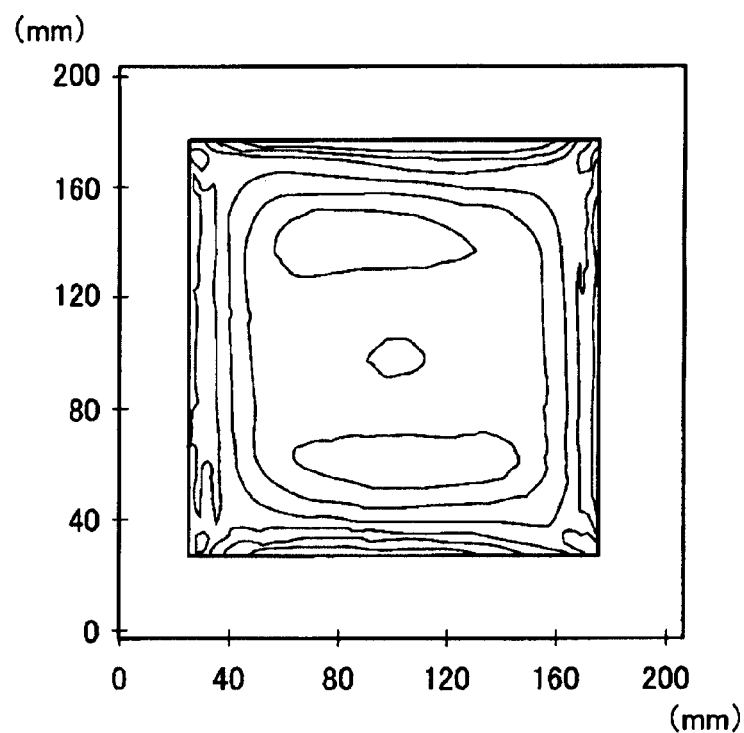
FIG. 4B is a contour diagram showing the shape of the main surface of the substrate to which this invention is applied, wherein the shape of the main surface of the substrate after chucking on the chuck stages of the exposure apparatus is illustrated.

FIGS. 4A and 4B are diagrams showing the shapes of a substrate according to this invention before (before suction) and after (after suction) chucking the substrate on a mask stage of an exposure apparatus, wherein FIG. 4A is a diagram showing the shape of the substrate before suction and FIG. 4B is a diagram showing the shape of the substrate after suction. As seen from FIG. 4A, four corners of a main surface of the substrate are a little higher than chuck areas of the main surface and the main surface gradually increases in height toward its center. That is, generally circular contour lines are shown in the substrate before suction. In the substrate after suction, as seen from FIG. 4B, generally rectangular contour lines are shown wherein the number of contour lines in a 132 mm square is small and the intervals thereof are long. That is, the shape of the substrate main surface after chucking is significantly improved in flatness as compared with that before chucking.

Taking this tendency into account, an ideal substrate (virtual reference substrate) is assumed for a mask blank substrate of this invention such that the shape of its main surface (virtual reference main surface) is a convex shape being relatively high at its central portion and relatively low at its peripheral portion and is a spherical shape having a height difference of at least 0.3 μm or less in a 132 mm square area of the virtual reference substrate. As a result of simulating the shape of the virtual reference main surface after chucking a photomask using this virtual reference substrate in an exposure apparatus, the flatness of the virtual reference main surface is 0.08 μm or less. Fitting is performed with respect to the reference curved surface shape of the virtual reference substrate in a 132 mm square area, including a central portion, of a main surface, on the side where a thin film is to be formed, of a substrate actually manufactured by carrying out predetermined polishing. If the difference therebetween is 40 nm or less and the flatness in a 142 mm square area, including the central portion, of the main surface of the actually manufactured substrate is 0.3 μm or less, the actually manufactured substrate is judged to be a passed mask blank substrate. The mask blank substrate thus obtained can satisfy the flatness required for a photomask of DRAM half-pitch (hp) 32 nm generation in a 132 mm square area being an area where a transfer pattern is formed.

When fitting the virtual reference main surface to the 132 mm square area in the main surface of the actually manufactured substrate (actual substrate) after polishing, it is preferable to perform the fitting in a height relationship in which the virtual reference main surface is at least higher than the main surface of the actual substrate at the boundary of the 132 mm square area. It is more preferable to perform the fitting in a height relationship in which the virtual reference main surface coincides in height as much as possible with the main surface of the actual substrate at the boundary of the 132 mm square area.

The spherical shape of the virtual reference main surface referred to herein is not limited to a partial shape of a complete spherical surface. Depending on a tendency of the sectional shape of an actual substrate after polishing due to characteristics of a polishing machine used in a polishing process and an suction force of a chuck at a mask stage of an exposure apparatus in which the actual substrate is used, there is a case where a tendency increases that a strong deformation force is applied more to a certain pair of end face sides of the substrate than to the other pair of end face sides perpendicular to the certain pair of end face sides. In such a case, the shape of the virtual reference main surface may be an elliptical spherical shape.

By applying this invention, polishing accuracy required when manufacturing the mask blank substrate is relaxed as compared with that required when manufacturing a substrate with very high flatness and, further, even a substrate that originally could not satisfy very high flatness can be shipped as a passed product that can fabricate a photomask adapted to exhibit sufficient transfer performance in a predetermined exposure apparatus. Thus, it is possible to significantly improve the yield. Much time is required for simulating manufactured substrates one by one, but in the case of this invention, it is only required to carry out fitting of manufactured substrates to the virtual reference main surface of the virtual reference substrate determined in advance and thus the time required for judging the substrates can be significantly reduced. Further, by selecting an ideal virtual reference main surface of a virtual reference substrate per chuck type of an exposure apparatus and then setting a commonly applicable virtual reference main surface of a virtual reference substrate based on those reference curved surfaces, it is possible to provide a mask blank substrate that can fabricate a photomask adapted to exhibit predetermined transfer performance regardless of the chuck structure of an exposure apparatus.

The reason for allowing, as a passed product, only the manufactured substrate having a flatness of 0.3 μm or less in the 142 mm square area, including the central portion, of the main surface thereof is that, in the case of a photomask having a flatness greater than 0.3 μm, the deformation amount upon chucking on an exposure apparatus is large so that the position offset in a plane direction of a transfer pattern formed on the photomask becomes large.

An area, where a transfer pattern is formed, of a photomask is within 132 mm×104 mm. However, since the deformation of a substrate is caused by chucking of the photomask by an exposure apparatus, it is necessary to also take into account an area outside the area where the transfer pattern is to be formed. If the flatness of the outside area is poor, there is a possibility that the deformation amount of the substrate after chucking is large. If the deformation amount of the substrate is large, the moving amount of the transfer pattern formed on a main surface of the substrate is large so that the pattern position accuracy is lowered. Taking them into account, the flatness measurement area in the actual substrate is set to be the 142 mm square area.

The manufactured substrate is judged to be a passed product if the difference upon performing fitting with respect to the reference curved surface shape of the virtual reference substrate in the 132 mm square area, including the central portion, of the main surface of the manufactured substrate is 40 nm or less. This difference upon performing the fitting is such that, upon fitting the main surface of the manufactured substrate to the reference curved surface, a maximum of 40 nm is allowed for the difference when the main surface of the manufactured substrate is located above the reference curved surface and a maximum of 40 nm is allowed for the difference when the main surface of the manufactured substrate is located below the reference curved surface.

Hereinbelow, an embodiment of this invention will be described in detail with reference to the accompanying drawings.

Figure 5A:
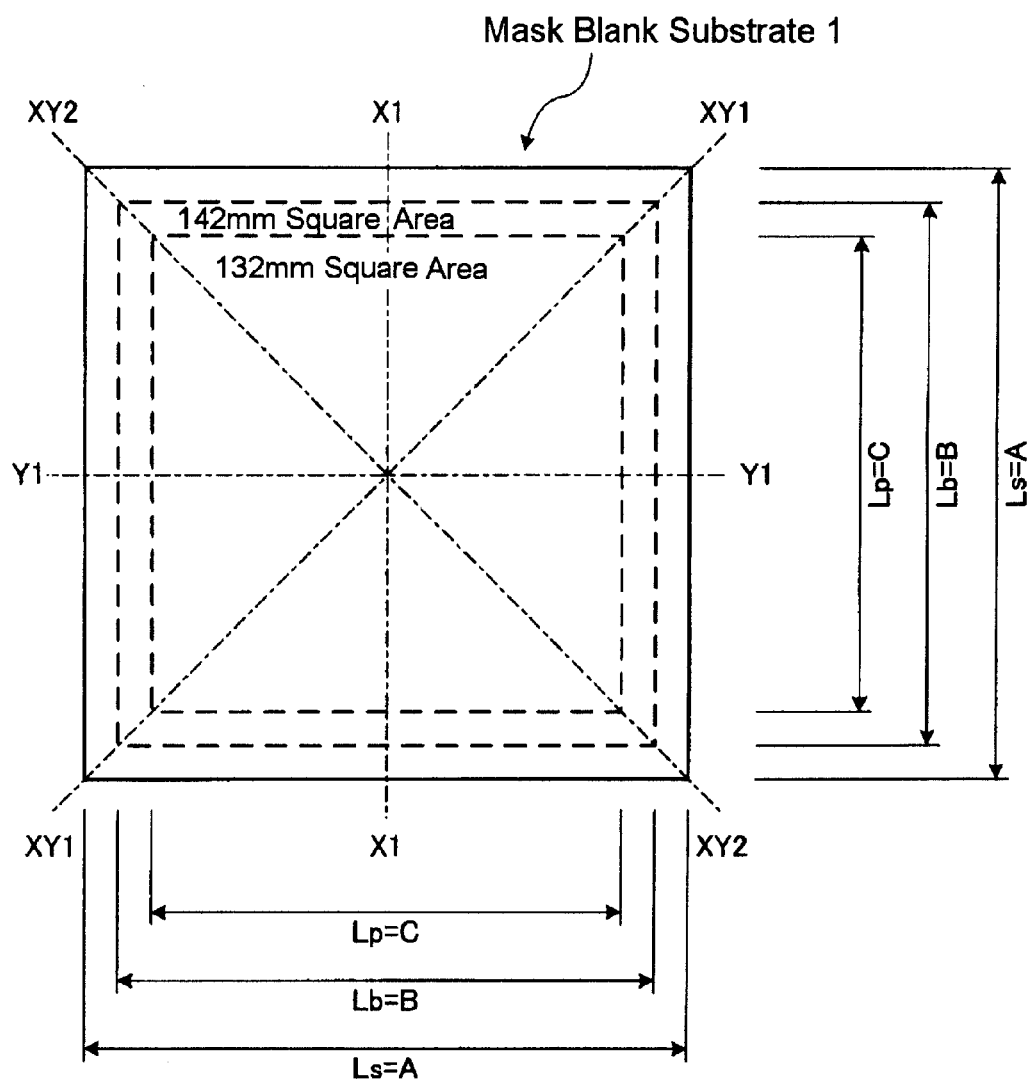
FIG. 5A is a plan view, as seen in a direction of a main surface, of a mask blank substrate according to an embodiment of this invention.
Figure 5B:
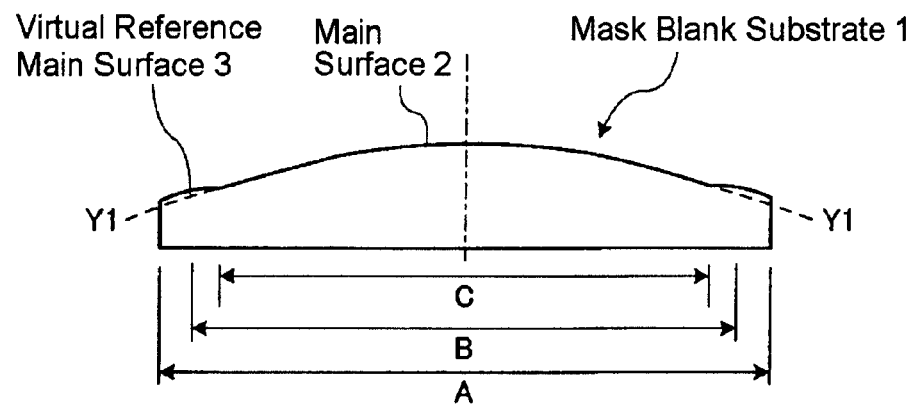
FIG. 5B is a sectional view taken along line Y1-Y1 in FIG. 5A.
Figure 5C:
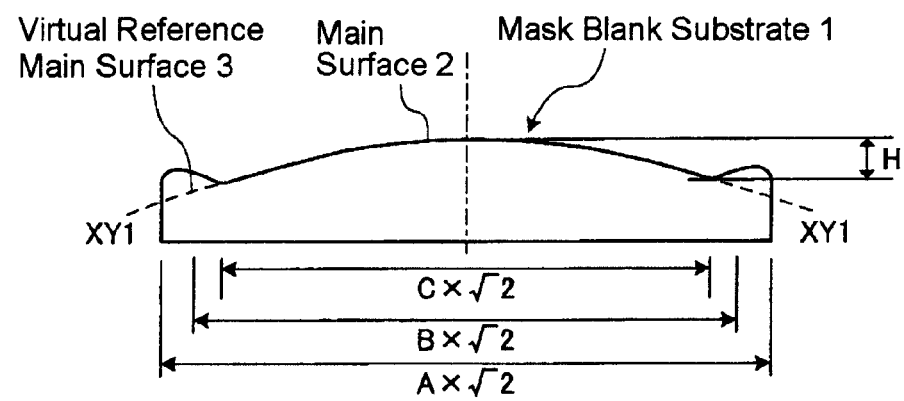
FIG. 5C is a sectional view taken along line XY1-XY1 in FIG. 5A.

FIGS. 5A to 5C are diagrams for explaining a mask blank substrate 1 according to the embodiment of this invention, wherein FIG. 5A is a plan view, FIG. 5B is a sectional view taken along line Y1-Y1 in FIG. 5A, and FIG. 5C is a sectional view taken along line XY1-XY1 in FIG. 5A. The shape shown in FIG. 5B is substantially the same as the shape in a sectional view taken along line X1-X1 in FIG. 5A and the shape shown in FIG. 5C is substantially the same as the shape in a sectional view taken along line XY2-XY2 in FIG. 5A.

In the mask blank substrate 1 shown in FIG. 5A, a main surface 2 on the side where a thin film for a transfer pattern is to be formed has a flatness of 0.3 µm or less in a 142 mm square area including its central portion and has a convex shape being relatively high at its central portion and relatively low at its peripheral portion. In FIG. 5A, it is given that the length of one side of the mask blank substrate 1 is Ls (A=152 mm), the length of one side of a 142 mm square area is Lb (B=142 mm), and the length of one side of a 132 mm square area is Lp (C=132 mm). The flatness in the 142 mm square area represents a difference H between the highest portion and the lowest portion of the mask blank substrate 1 in that area as shown in FIGS. 5B and 5C.

In the mask blank substrate 1, the difference upon fitting a predetermined virtual reference main surface of a virtual reference substrate to the shape of the main surface 2 is 40 nm or less. Herein, the virtual reference substrate is such that the shape of the virtual reference main surface is a convex shape being relatively high at its central portion and relatively low at its peripheral portion and is a spherical shape in a 132 mm square area of the virtual reference main surface. More specifically, the virtual reference substrate is such that the virtual reference main surface has a flatness of 0.3 µm or less, preferably 0.2 µm or less in the 132 mm square area including its central portion. Particularly in a virtual reference substrate for obtaining a mask blank substrate that can be commonly used for various chuck-type exposure apparatuses, it is preferable that a virtual reference main surface has a shape defined by a true spherical surface.

Figure 6:
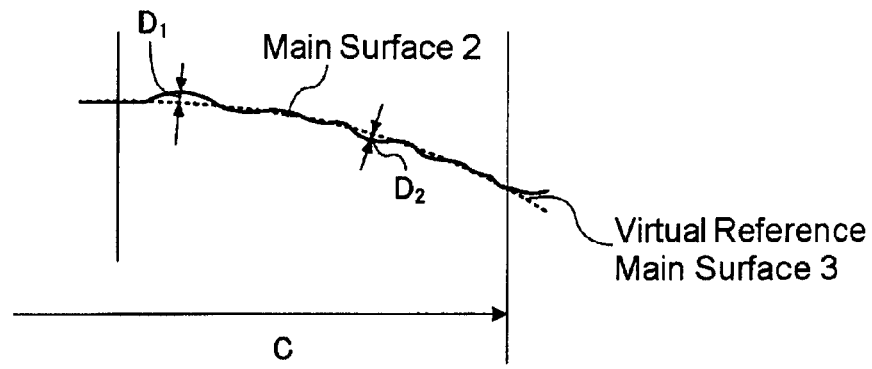
FIG. 6 is a diagram showing a partial enlarged section of the mask blank substrate shown in FIG. 5B.

FIG. 6 is a partial enlarged sectional view of the mask blank substrate 1 shown in FIG. 5B. A virtual reference main surface 3 is a main surface of a virtual reference substrate and FIG. 6 shows a state where the virtual reference main surface 3 is fitted to the main surface 2. In FIG. 6, $D_1$ and $D_2$ represent differences upon performing fitting to the virtual reference main surface 3 in the 132 mm square area (area indicated by Lp in FIG. 5A), including the central portion, of the main surface 2. $D_1$ represents a maximum difference (absolute value) among differences at portions where the main surface 2 is located above the virtual reference main surface 3, while, $D_2$ represents a maximum difference (absolute value) among differences at portions where the main surface 2 is located below the virtual reference main surface 3. Of these differences $D_1$ and $D_2$, the larger difference is 40 nm or less.

The above-mentioned measurement area is preferably the 132 mm square area, including the central portion, of the mask blank substrate 1. By ensuring the flatness in this area, transfer of a fine pattern can be accurately carried out.

The shape of the main surface 2 of the mask blank substrate 1 was measured by a wavelength-shift interferometer using a wavelength modulation laser. This wavelength-shift interferometer calculates differences in height of a measuring surface of a mask blank substrate from interference fringes generated by the interference between reflected light reflected from the measuring surface and a back surface of the mask blank substrate and a measuring apparatus reference surface (front reference surface), detects differences in frequency of the interference fringes, and separates the interference fringes, thereby measuring the shape of irregularities of the measuring surface.

In this invention, a glass substrate can be used as the mask blank substrate. The glass substrate is not particularly limited as long as it can be used for a mask blank. For example, as a material of the glass substrate, there can be cited a synthetic quartz glass, a soda-lime glass, an aluminosilicate glass, a borosilicate glass, an alkali-free glass, or the like. In the case of a glass substrate of an EUV mask blank, in order to suppress the distortion of a transfer pattern due to heat in exposure, use is made of a glass material having a low thermal expansion coefficient in a range of about $0 \pm 1.0 \times 10^{-7}/°C$., preferably in a range of about $0 \pm 0.3 \times 10^{-7}/°C$. Further, since the EUV mask blank is formed with many films on the glass substrate, use is made of a high-rigidity glass material that can suppress deformation due to film stress. Particularly, a glass material having a high Young's modulus of 65 GPa or more. For example, use is made of an amorphous glass such as a $SiO_2$—$TiO_2$-based glass or a synthetic quartz glass or a crystallized glass in which a β-quartz solid solution is precipitated.

Such a mask blank substrate can be manufactured through, for example, a rough polishing process, a precision polishing process, and an ultra-precision polishing process.

A substrate to be manufactured is polished so as to be fitted to the shape of the virtual reference main surface of the virtual reference substrate. When the shape of the reference curved surface to be fitted to is, for example, a spherical surface, the shape of the substrate is adjusted in the respective polishing processes so as to approximate a curved surface defined by $x^2+y^2+z^2=r^2$ (r: radius of curvature). The curved surface shape of the virtual reference main surface having a flatness of 0.3 µm or less in the 132 mm square area is such that its radius of curvature r is about 14,500,000 mm or more, and the curved surface shape of the virtual reference main surface having a flatness of 0.2 µm or less in the 132 mm square area is such that its radius of curvature r is about 21,720,000 mm or more.

By forming at least a light-shielding film on the main surface, having the above-mentioned convex shape, of the mask blank substrate described above, a mask blank can be obtained. As a material of this light-shielding film, chromium or molybdenum silicide can be cited. In the case of a chromium-based light-shielding film, nitrogen, oxygen, and/or carbon may be added to Cr. In the case of a molybdenum silicide-based light-shielding film, nitrogen, oxygen, and/or carbon may be added to MoSi.

Depending on the use and structure of a photomask, another film such as an antireflection film or a semi-transmissive film may be appropriately formed. As a material of the antireflection film, it is preferable to use MoSiON, MoSiO, MoSiN, MoSiOC, MoSiOCN, or the like. As a material of the semi-transmissive film, it is preferable to use CrO, CrON, MoSiN, MoSiON, or the like.

Further, an etching mask film having etching resistance to the light-shielding film or the antireflection film may be formed on such a film and an etching stopper film may be formed between the substrate and the light-shielding film.

The light-shielding film can be formed by sputtering. As a sputtering apparatus, it is possible to use a DC magnetron sputtering apparatus, an RF magnetron sputtering apparatus, or the like. When sputtering the light-shielding film on the mask blank substrate, it is preferable to rotate the substrate and to dispose a sputtering target at a position inclined by a predetermined angle with respect to a rotational axis of the substrate, thereby forming the light-shielding film. By such a film forming method, it is possible to minimize in-plane variation of the light-shielding film and thus to uniformly form the light-shielding film. Since the mask blank substrate of this invention is such that the main surface has a convex shape describing a predetermined curved surface (e.g. quadratic surface) from the substrate center as a vertex toward the outside, and thus is a highly symmetric substrate, it is possible to obtain a mask blank with high in-plane symmetry by forming the light-shielding film in the manner described above.

Figure 7:
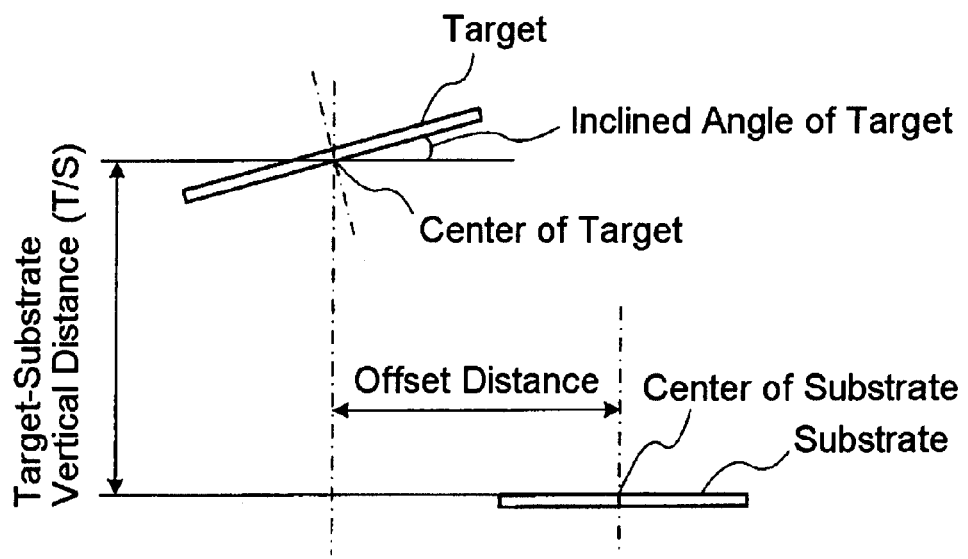
FIG. 7 is a diagram showing a schematic structure of a sputtering apparatus for use in manufacturing a mask blank according to the embodiment of this invention.

In the case of carrying out the film formation by rotating the substrate and disposing the sputtering target at the position inclined by the predetermined angle with respect to the rotational axis of the substrate, the in-plane distributions of the phase angle and the transmittance also change by the positional relationship between the substrate and the target. The positional relationship between the substrate and the target will be explained with reference to FIG. 7. The offset distance (distance between the central axis of the substrate and a straight line passing through the center of the target and parallel to the central axis of the substrate) is adjusted by an area in which the phase angle and transmittance distributions are to be ensured. Generally, when such an area is large, the required offset distance becomes long. In this embodiment, in order to realize a phase angle distribution±2° or less and a transmittance distribution±0.2° or less in the substrate in the 142 mm square area, the offset distance is required to be about 200 mm to about 350 mm and is preferably 240 mm to 280 mm. The optimal range of the target-substrate vertical distance (T/S) changes depending on the offset distance, but in order to realize a phase angle distribution±2° or less and a transmittance distribution±0.2° or less in the substrate in the 142 mm square area, the target-substrate vertical distance (T/S) is required to be about 200 mm to about 380 mm and is preferably 210 mm to 300 mm. The inclination angle of the target affects the film forming rate and, in order to obtain a high film forming rate, it is suitably 0° to 45° and preferably 10° to 30°.

By patterning at least the light-shielding film by photolithography and etching to form a transfer pattern, a photomask can be manufactured. An etchant for etching is properly changed depending on a material of a film to be etched.

Next, a description will be given of Examples carried out for clarifying the effect of this invention. In the following Examples, a mask blank substrate is a glass substrate.

EXAMPLE 1

The shape of a mask blank substrate to be manufactured in Example 1 is such that the shape of a virtual reference main surface of a virtual reference substrate is a curved surface shape in the form of a spherical surface having a radius of curvature r of 14,508,150 mm and having a flatness of 0.3 µm in a 132 mm square area and a main surface thereof is polished so as to be fitted to this shape of the virtual reference main surface. Specifically, the mask blank substrate is manufactured through the following polishing processes.

A predetermined number of glass substrates obtained by lapping and chamfering synthetic quartz glass substrates (152.4 mm×152.4 mm×6.45 mm) were set in a double-side polishing machine and subjected to a rough polishing process under the following polishing conditions. After the rough polishing process, the glass substrates were ultrasonically cleaned for removing polishing abrasive grains adhering to the glass substrates. The polishing conditions such as the processing pressure, the rotational speeds of upper and lower surface plates, and the polishing time were properly adjusted.

Polishing Liquid: cerium oxide (average grain size 2 µm to 3 µm)+water

Polishing Pad: hard polisher (urethane pad)

Then, a predetermined number of the glass substrates after the rough polishing were set in a double-side polishing machine and subjected to a precision polishing process under the following polishing conditions. After the precision polishing process, the glass substrates were ultrasonically cleaned for removing polishing abrasive grains adhering to the glass substrates. The polishing conditions such as the processing pressure, the rotational speeds of upper and lower surface plates, and the polishing time were properly adjusted. The precision polishing is carried out by adjusting various conditions so that the shape of a main surface, on the side where a transfer pattern is to be formed, of each glass substrate after the precision polishing process becomes convex at four corners. This is because the next ultra-precision polishing process has a feature to preferentially polish four corners of the substrate main surface, and thus this makes it possible to prevent edge exclusion at the four corners and to achieve a flatness of 0.3 µm or less in a 142 mm square area of the substrate main surface.

Polishing Liquid: cerium oxide (average grain size 1 µm)+water

Polishing Pad: soft polisher (suede type)

Then, a predetermined number of the glass substrates after the precision polishing were set in a double-side polishing machine and subjected to the ultra-precision polishing process under the following polishing conditions. After the ultra-precision polishing process, the glass substrates were ultrasonically cleaned for removing polishing abrasive grains adhering to the glass substrates. The polishing conditions such as the processing pressure, the rotational speeds of upper and lower surface plates, and the polishing time were properly adjusted. In this ultra-precision polishing process, the four corners tend to be preferentially polished due to the substrate shape being square. The polishing conditions are set so that the flatness in the 142 mm square area of the substrate main surface does not exceed 0.3 µm while the surface roughness of the substrate main surface becomes a predetermined roughness of 0.4 nm or less.

In this manner, the glass substrates according to this invention were manufactured.

Polishing Liquid: colloidal silica (average grain size 100 nm)+water

Polishing Pad: super-soft polisher (suede type)

The shape of the main surfaces of the glass substrates thus obtained was measured by a wavelength-shift interferometer using a wavelength modulation laser. As a result, the shape of each glass substrate was such that the main surface where a thin film for a transfer pattern was to be formed had a convex shape being relatively high at its center and relatively low at its peripheral portion. The glass substrates having a difference of 40 nm or less upon fitting to the virtual reference main surface, i.e. passed products usable as mask blank substrates of this invention, were 95 out of 100 and thus could be manufactured with a higher yield than that according to a conventional substrate selection method (passed products were 80 out of 100).

Then, a back-surface antireflection layer, a light-shielding layer, and a front-surface antireflection layer were formed in this order as a light-shielding film on each of the glass substrates obtained as described above. Specifically, using a Cr target as a sputtering target and using a mixed gas of Ar, $CO_2$, $N_2$, and He (gas flow rate ratio Ar:$CO_2$:$N_2$:He=24:29:12:35) as a sputtering gas, a CrOCN film was formed to a thickness of 39 nm as the back-surface antireflection layer by setting the gas pressure to 0.2 Pa and the power of the DC power supply to 1.7 kW. Then, using a Cr target as a sputtering target and using a mixed gas of Ar, NO, and He (gas flow rate ratio Ar:NO:He=27:18:55) as a sputtering gas, a CrON film was formed to a thickness of 17 nm as the light-shielding layer by setting the gas pressure to 0.1 Pa and the power of the DC power supply to 1.7 kW. Then, using a Cr target as a sputtering target and using a mixed gas of Ar, $CO_2$, $N_2$, and He (gas flow rate ratio Ar:$CO_2$:$N_2$:He=21:37:11:31) as a sputtering gas, a CrOCN film was formed to a thickness of 14 nm as the front-surface antireflection layer by setting the gas pressure to 0.2 Pa and the power of the DC power supply to 1.8 kW. The back-surface antireflection layer, the light-shielding layer, and the front-surface antireflection layer formed under these conditions had very low stress over the entire light-shielding film and thus it was possible to suppress the change in shape of the substrate to minimum. In this manner, mask blanks were manufactured.

By patterning the light-shielding film of each of the mask blanks thus obtained, photomasks (binary masks) were manufactured. The obtained photomasks were set in three exposure apparatuses having different vacuum chuck structures and an inspection was conducted. The exposure apparatuses were of the type in which the chuck structure of a mask stage used, as chuck areas, portions of a main surface on two opposite end face sides of a photomask, and a selection was made of two kinds of exposure apparatuses in which portions with which the chuck areas of the photomask were brought into contact were made of a low-elasticity material, i.e. exposure apparatuses of a so-called hard chuck structure, and of one kind of exposure apparatus in which portions with which the chuck areas of the photomask were brought into contact were made of a high-elasticity material, i.e. exposure apparatus of a so-called soft chuck structure. The flatness was derived by a wavelength-shift interferometer using a wavelength modulation laser. As a result, in any of the exposure apparatuses, the flatness of the photomask after chucking was 0.12 μm or less and it was possible to obtain excellent transfer performance as a photomask of DRAM hp32 nm generation.

EXAMPLE 2

In Example 2, the shape of a virtual reference main surface of a virtual reference substrate to be aimed at was a curved surface shape in the form of a spherical surface having a radius of curvature r of 21,762,225 mm and having a flatness of 0.2 μm in a 132 mm square area and glass substrates were manufactured by properly adjusting the polishing conditions in the same polishing processes as those in Example 1. Then, the shape of main surfaces of the glass substrates thus obtained was measured by a wavelength-shift interferometer using a wavelength modulation laser. As a result, the shape of each glass substrate was such that the main surface where a thin film for a transfer pattern was to be formed had a convex shape being relatively high at its center and relatively low at its peripheral portion.

Figure 8:
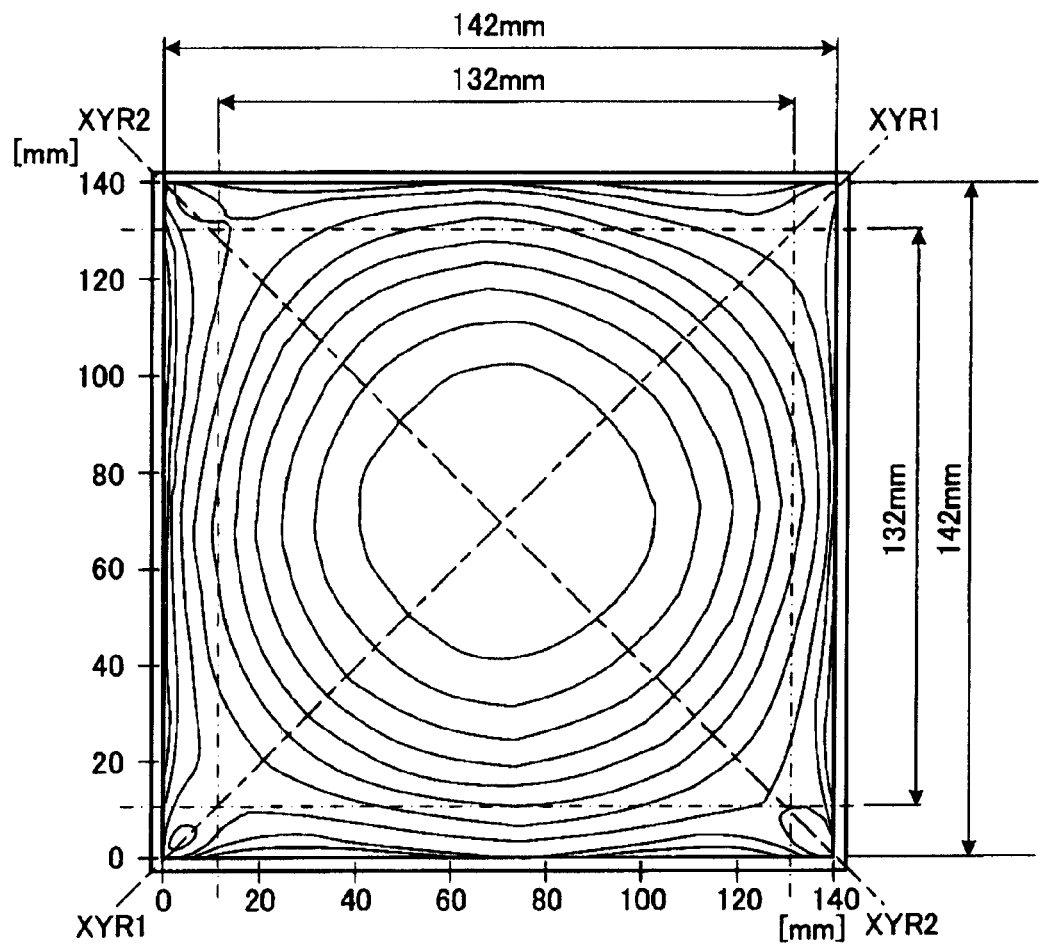
FIG. 8 is a contour diagram showing the shape of a main surface of a glass substrate manufactured in Example 2.
Figure 9:
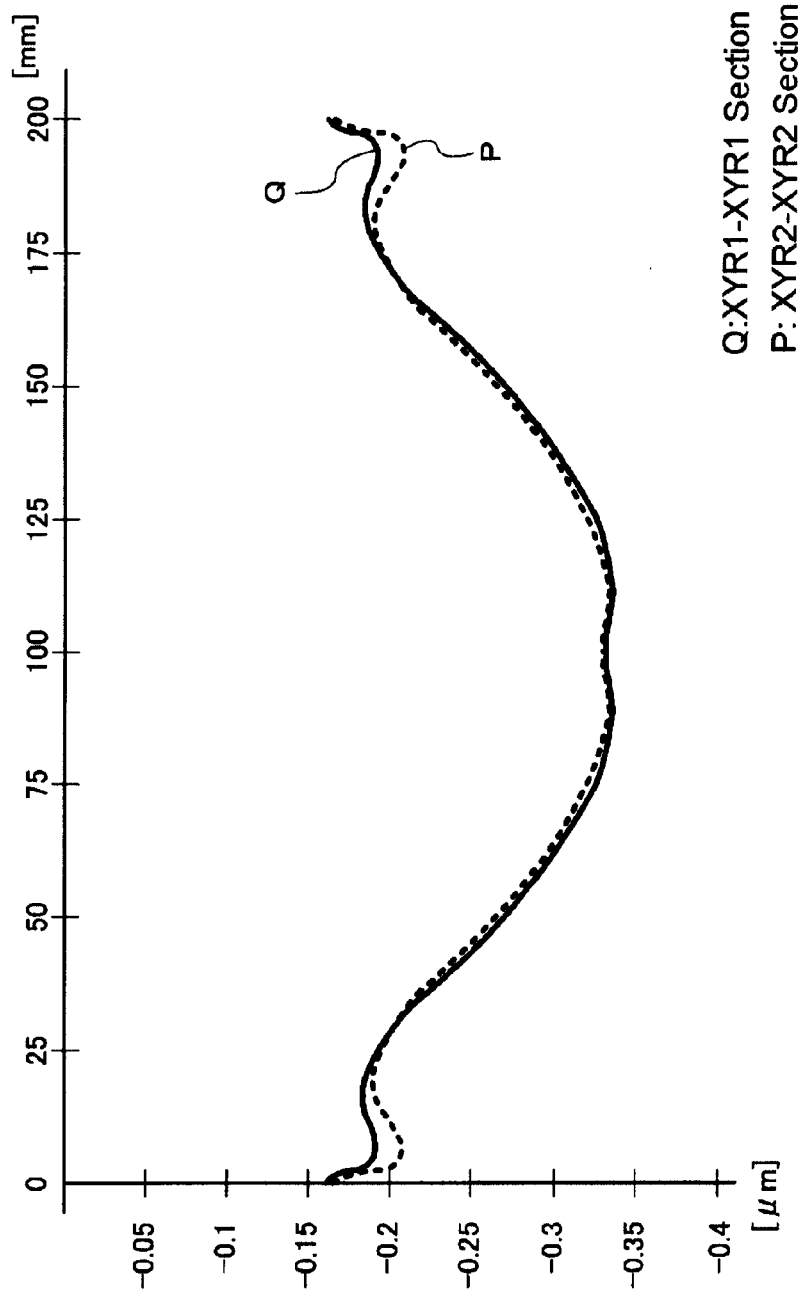
FIG. 9 is a diagram showing the shapes of the main surface in sections along line XYR1-XYR1 and line XYR2-XYR2 of the glass substrate shown in FIG. 8.
Figure 10:
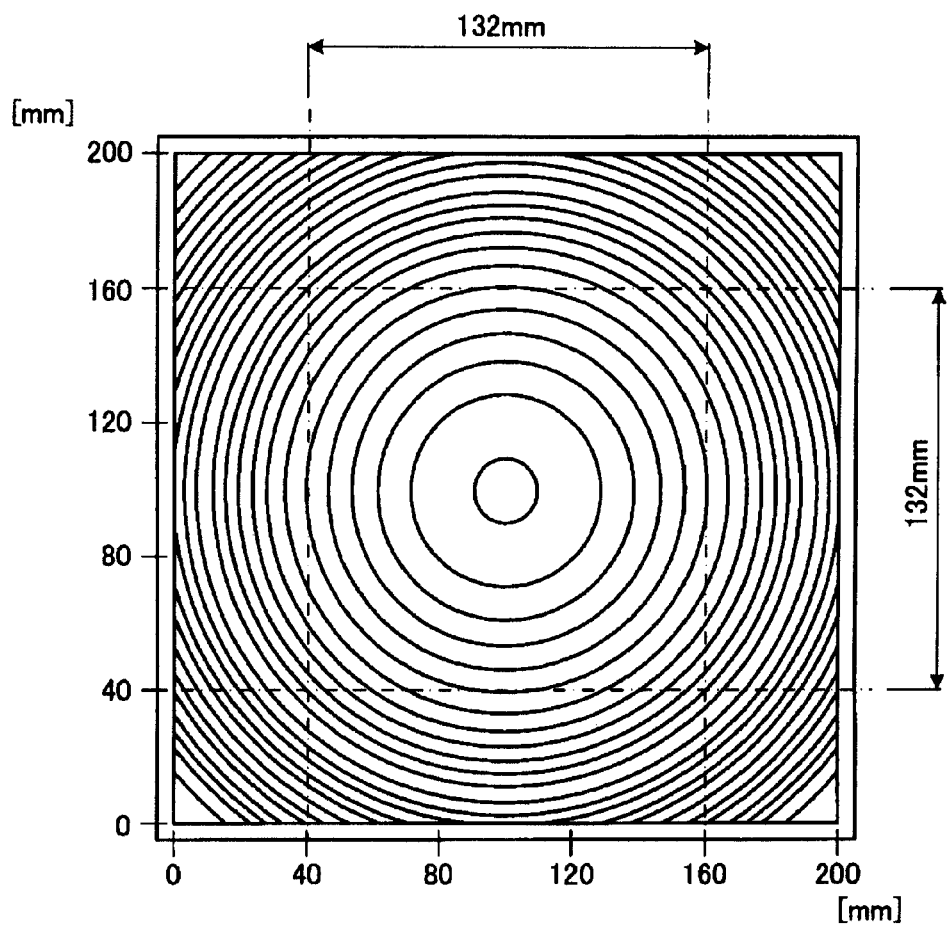
FIG. 10 is a contour diagram showing the shape of a virtual reference main surface.
Figure 11:
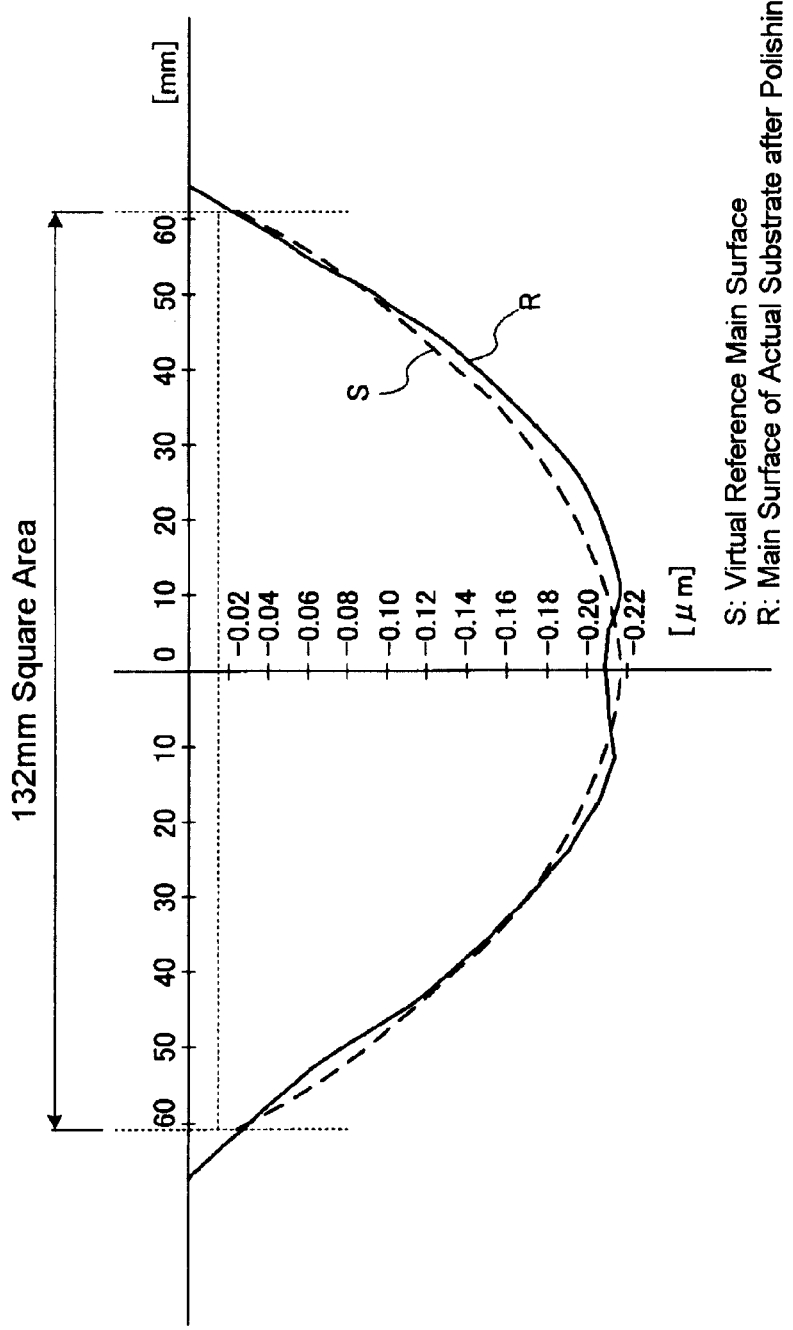
FIG. 11 is a diagram upon fitting the virtual reference main surface shown in FIG. 10 to the glass substrate shown in FIG. 8.
Figure 12:
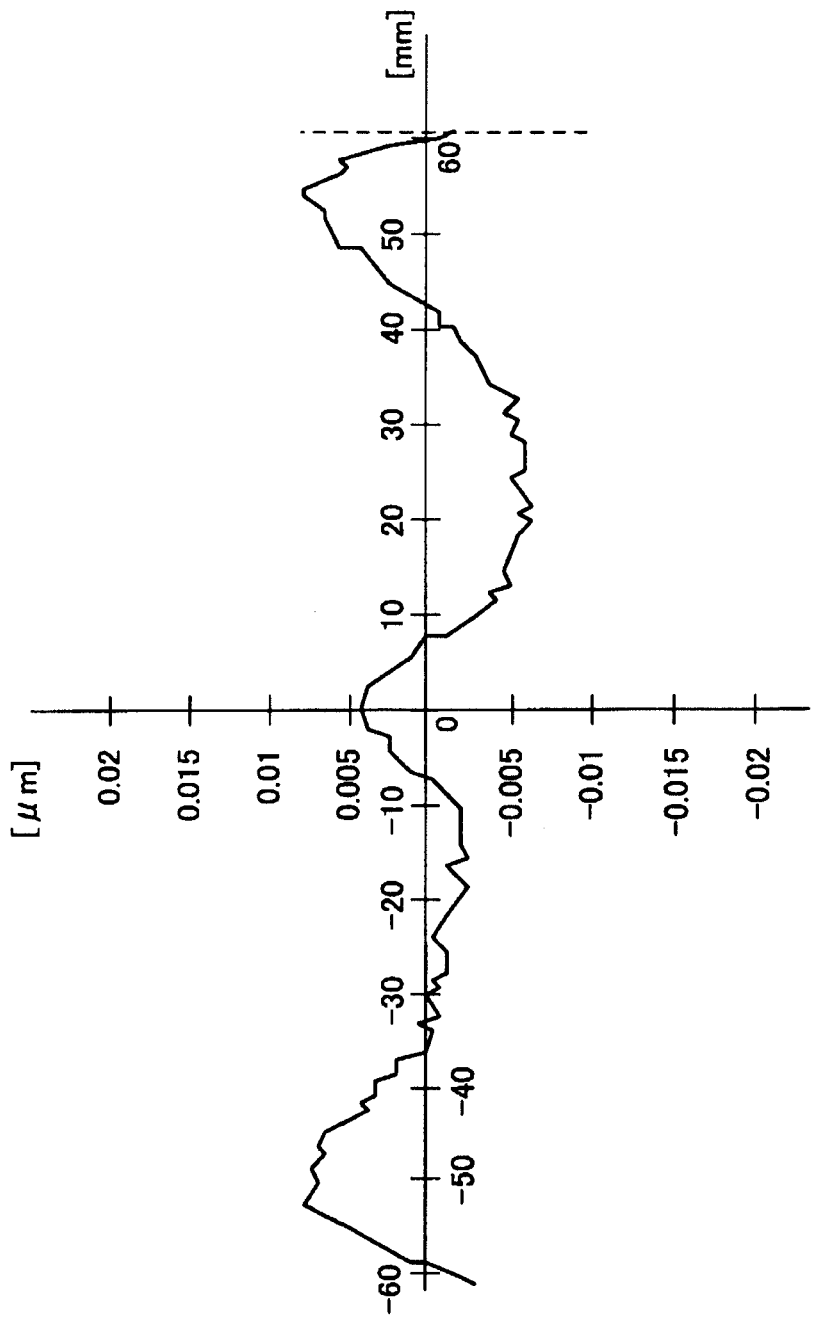
FIG. 12 is a diagram showing fitting differences upon performing the fitting in FIG. 11.

Then, fitting was carried out between the virtual reference main surface and each of the manufactured glass substrates. FIG. 8 is a contour diagram showing the shape of the main surface measured by the wavelength-shift interferometer with respect to one of the manufactured glass substrates. FIG. 9 shows the shapes of the main surface in sections along diagonals (line XYR1-XYR1 and line XYR2-XYR2 in FIG. 8) of the glass substrate shown in FIG. 8. As a result of the measurement, the flatness in a 142 mm square area of this glass substrate was 0.19 μm and the flatness in a 132 mm square area thereof was 0.18 μm, thus satisfying the intended flatness of 0.2 μm or less. FIG. 10 is a contour diagram showing the shape of the virtual reference main surface, for carrying out fitting in its 132 mm square area, of the virtual reference substrate. FIG. 11 shows one sectional shape upon fitting the virtual reference main surface of FIG. 10 to the glass substrate of FIG. 8 in the 132 mm square area. FIG. 12 shows differences between the main surface of the glass substrate and the ideal reference main surface shape upon performing the fitting in FIG. 11. With respect to the differences shown in FIG. 12, a portion where the height of the virtual reference main surface is higher than the height of the main surface of the glass substrate upon fitting is represented by a positive value, while, a portion where the height of the main surface of the glass substrate is higher upon fitting is represented by a negative value.

As seen from the results shown in FIG. 12, the fitting difference was 0.0075 μm (7.5 nm) in positive value and −0.0067 μm (6.7 nm) in negative value and thus the results were very excellent. Even over the entire 132 mm square area, the fitting difference was 0.011 μm (11 nm) at maximum and thus 40 nm or less and, therefore, the manufactured glass substrate was a passed product with high accuracy. Likewise, as a result of fitting the virtual reference main surface to the other manufactured glass substrates, the glass substrates having a difference of 40 nm or less upon fitting, i.e. passed products usable as mask blank substrates of this invention, were 90 out of 100 and thus could be manufactured with a higher yield than that according to a conventional substrate selection method (passed products were 80 out of 100).

Then, under the same film forming conditions as in Example 1, a back-surface antireflection layer, a light-shielding layer, and a front-surface antireflection layer were formed in this order as a light-shielding film on each of the glass substrates obtained as described above, thereby manufacturing mask blanks. Further, by patterning the light-shielding film of each of the mask blanks thus obtained, photomasks (binary masks) were manufactured. Like in Example 1, the obtained photomasks were set in three kinds of exposure apparatuses having different vacuum chuck structures and an inspection was conducted. The flatness was derived by a wavelength-shift interferometer using a wavelength modulation laser. As a result, in any of the exposure apparatuses, the flatness of the photomask after chucking was 0.08 μm or less and it was possible to obtain sufficiently excellent transfer performance not only as a photomask of DRAM hp32 nm generation, but also as a photomask of DRAM hp22 nm generation.

EXAMPLE 3

A phase shift film and a laminated film, as a light-shielding film, composed of a back-surface antireflection layer, a light-shielding layer, and a front-surface antireflection layer were formed on each of the glass substrates manufactured in Example 1. Specifically, using a mixed target of Mo and Si (at % ratio Mo:Si=10:90) as a sputtering target and using a mixed gas of Ar, $N_2$, and He (gas flow rate ratio Ar:$N_2$:He=5:49:46) as a sputtering gas, a MoSiN film was formed to a thickness of 69 nm as the phase shift film by setting the gas pressure to 0.3 Pa and the power of the DC power supply to 2.8 kW. Then, the substrates formed with the phase shift film were heat-treated (annealed) at 250° C. for 5 minutes.

Then, the light-shielding film comprising the back-surface antireflection layer, the light-shielding layer, and the front-surface antireflection layer was formed on the phase shift film. Specifically, first, using a Cr target as a sputtering target and using a mixed gas of Ar, $CO_2$, $N_2$, and He (gas flow rate ratio Ar:$CO_2$:$N_2$:He=22:39:6:33) as a sputtering gas, a CrOCN film was formed to a thickness of 30 nm as the back-surface antireflection layer by setting the gas pressure to 0.2 Pa and the power of the DC power supply to 1.7 kW. Then, using a Cr target as a sputtering target and using a mixed gas of Ar and $N_2$ (gas flow rate ratio Ar:$N_2$=83:17) as a sputtering gas, a CrN film was formed to a thickness of 4 nm as the light-shielding layer by setting the gas pressure to 0.1 Pa and the power of the DC power supply to 1.7 kW. Then, using a Cr target as a sputtering target and using a mixed gas of Ar, $CO_2$, $N_2$, and He (gas flow rate ratio Ar:$CO_2$:$N_2$:He=21:37:11:31) as a sputtering gas, a CrOCN film was formed to a thickness of 14 nm as the front-surface antireflection layer by setting the gas pressure to 0.2 Pa and the power of the DC power supply to 1.8 kW. The back-surface antireflection layer, the light-shielding layer, and the front-surface antireflection layer formed under these conditions had very low stress over the entire light-shielding film and the phase shift film also had very low stress, and thus it was possible to suppress the change in shape of the substrate to minimum.

By patterning the light-shielding film and the phase shift film of each of mask blanks thus obtained, photomasks (phase shift masks) were manufactured. Like in Example 1, the obtained photomasks were set in three kinds of exposure apparatuses having different vacuum chuck structures and an inspection was conducted. The flatness was derived by a wavelength-shift interferometer using a wavelength modulation laser. As a result, in any of the exposure apparatuses, the flatness of the photomask after chucking was 0.12 μm or less and it was possible to obtain excellent transfer performance as a photomask of DRAM hp32 nm generation.

EXAMPLE 4

A phase shift film and a laminated film, as a light-shielding film, composed of a back-surface antireflection layer, a light-shielding layer, and a front-surface antireflection layer, all of which had the same structures as in Example 3, were formed on each of the glass substrates manufactured in Example 2. By patterning the light-shielding film and the phase shift film of each of mask blanks thus obtained, photomasks (phase shift masks) were manufactured. Like in Example 1, the obtained photomasks were set in three kinds of exposure apparatuses having different vacuum chuck structures and an inspection was conducted. The flatness was derived by a wavelength-shift interferometer using a wavelength modulation laser. As a result, in any of the exposure apparatuses, the flatness of the photomask after chucking was 0.08 μm or less and it was possible to obtain sufficiently excellent transfer performance not only as a photomask of DRAM hp32 nm generation, but also as a photomask of DRAM hp22 nm generation.

EXAMPLE 5

A MoSiON film (back-surface antireflection layer), a MoSi film (light-shielding layer), and a MoSiON film (front-surface antireflection layer) were formed as a light-shielding film on each of the glass substrates manufactured in Example 1. Specifically, using a mixed target of Mo:Si=21:79 (at % ratio) as a sputtering target and using a mixed gas of Ar, $O_2$, $N_2$, and He (gas flow rate ratio Ar:$O_2$:$N_2$:He=5:4:49:42) as a sputtering gas, a film made of molybdenum, silicon, oxygen, and nitrogen (MoSiON film: at % ratio of Mo and Si in the film was about 21:79) was formed to a thickness of 7 nm by setting the sputtering gas pressure to 0.2 Pa and the power of the DC power supply to 3.0 kW. Then, using the same target and using Ar as a sputtering gas, a film made of molybdenum and silicon (MoSi film: at % ratio of Mo and Si in the film was about 21:79) was formed to a thickness of 35 nm by setting the sputtering gas pressure to 0.1 Pa and the power of the DC power supply to 2.0 kW. Then, using a mixed target of Mo:Si=4:96 (at % ratio) as a sputtering target and using a mixed gas of Ar, $O_2$, $N_2$, and He (gas flow rate ratio Ar:$O_2$:$N_2$:He=5:4:49:42) as a sputtering gas, a film made of molybdenum, silicon, oxygen, and nitrogen (MoSiON film: at % ratio of Mo and Si in the film was about 4:96) was formed to a thickness of 10 nm by setting the sputtering gas pressure to 0.2 Pa and the power of the DC power supply to 3.0 kW. The total thickness of the light-shielding film was set to 52 nm. The back-surface antireflection layer, the light-shielding layer, and the front-surface antireflection layer formed under these conditions had very low stress over the entire light-shielding film and thus it was possible to suppress the change in shape of the substrate to minimum.

By patterning the light-shielding film of each of mask blanks thus obtained, photomasks (binary masks) were manufactured. Like in Example 1, the obtained photomasks were set in three kinds of exposure apparatuses having different vacuum chuck structures and an inspection was conducted. As a result, in any of the exposure apparatuses, the flatness of the photomask after chucking was 0.12 μm or less and it was possible to obtain excellent transfer performance as a photomask of DRAM hp32 nm generation.

EXAMPLE 6

A light-shielding film in which a MoSiON film (back-surface antireflection layer), a MoSi film (light-shielding layer), and a MoSiON film (front-surface antireflection layer), all of which had the same structures as in Example 5, were stacked in this order was formed on each of the glass substrates manufactured in Example 2. By patterning the light-shielding film of each of mask blanks thus obtained, photomasks (binary masks) were manufactured. Like in Example 1, the obtained photomasks were set in three kinds of exposure apparatuses having different vacuum chuck structures and an inspection was conducted. The flatness was derived by a wavelength-shift interferometer using a wavelength modulation laser. As a result, in any of the exposure apparatuses, the flatness of the photomask after chucking was 0.08 μm or less and it was possible to obtain sufficiently excellent transfer performance not only as a photomask of DRAM hp32 nm generation, but also as a photomask of DRAM hp22 nm generation.

EXAMPLE 7

Local processing by an MRF (Magneto-Rheological Finishing) processing method was applied to the main surfaces of the glass substrates having been subjected to the ultra-precision polishing process and the ultrasonic cleaning in Example 1. First, the flatness of the main surface of the glass substrate was measured by a wavelength-shift interferometer using a wavelength modulation laser (measurement area: 142 mm square area having its center at the center of the substrate). Then, based on measured values, it was verified whether the flatness of the substrate main surface in the 142 mm square area was 0.3 μm or less. If the flatness exceeded 0.3 μm, a portion having a height exceeding 0.3 μm as seen from the lowest portion was specified as a portion where local processing was necessary, and the required processing amount was calculated. Then, based on the measured values of the substrate main surface, the reference curved surface of the virtual reference substrate was fitted to the 132 mm square area of the substrate main surface. In this case, the fitting was performed so that the reference curved surface was not located at a height above the predetermined maximum allowable fitting difference (40 nm) with respect to the substrate main surface in the 132 mm square area. Then, a portion of the substrate main surface located above the predetermined maximum allowable fitting difference (40 nm) with respect to the reference curved surface fitted was specified as a portion where local processing was necessary, and the required processing amount was calculated. At this stage, the substrate for which it was judged that no local processing was necessary was a passed product usable as a mask blank substrate of this invention.

Then, local processing by the MRF processing method was applied to the glass substrate for which the local processing was judged necessary and a portion for the local processing was specified. The MRF processing method is a method of locally polishing a substrate by bringing polishing abrasive grains contained in a magnetic fluid into contact with the substrate by magnetic field assist and controlling the stay time of the polishing abrasive grains at a contact portion. In this polishing, as the convex degree of a convex portion increases, the stay time of the polishing abrasive grains at a contact portion is set to be longer. Conversely, as the convex degree of a convex portion decreases, the stay time of the polishing abrasive grains at a contact portion is set to be shorter.

Figure 13A:
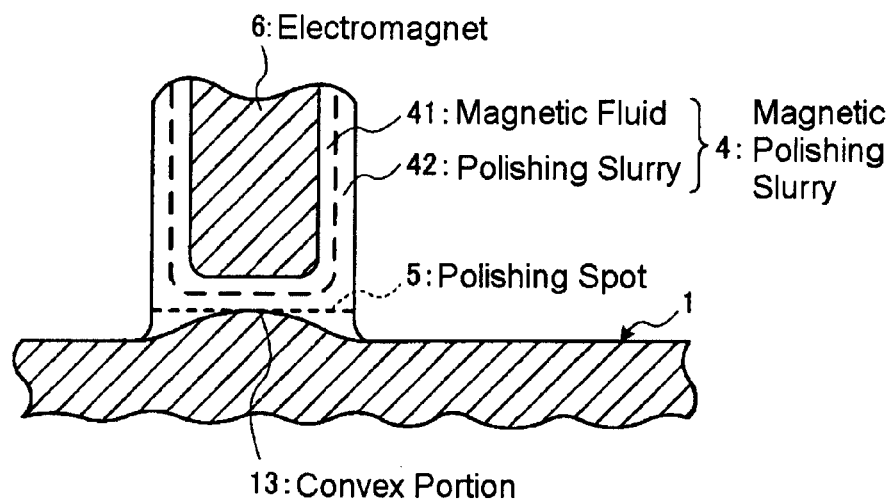
FIG. 13A is a schematic front sectional view for explaining a processing state by an MRF processing method in Example 7.
Figure 13B:
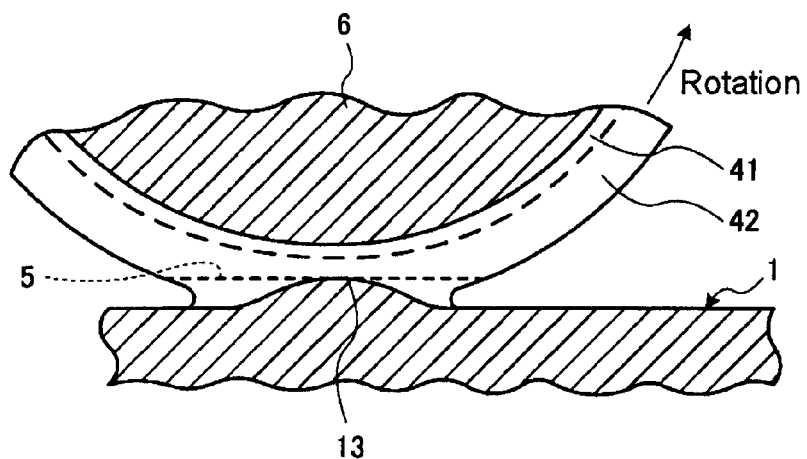
FIG. 13B is a schematic side sectional view for explaining the processing state by the MRF processing method in Example 7.

FIGS. 13A and 13B are schematic diagrams for explaining a processing state by the MRF processing method, wherein FIG. 13A is a front sectional view and FIG. 13B is a side sectional view. In the figures, according to the MRF processing method, a mask blank substrate 1 being a workpiece is locally polished by bringing polishing abrasive grains (not illustrated) contained in a magnetic fluid 41 containing iron (not illustrated) into contact with the mask blank substrate 1 at high speed by magnetic field assistance and controlling the stay time of the polishing abrasive grains at a contact portion. That is, a mixed liquid (magnetic polishing slurry 4) of the magnetic fluid 41 and a polishing slurry 42 is loaded on a rotatably supported disk-shaped electromagnet 6 so that a radial end of the magnetic polishing slurry 4 is used as a polishing spot 5 for local processing, and a convex portion 13 to be removed is brought into contact with the polishing spot 5. With this configuration, the magnetic polishing slurry 4 flows along a disk-shaped magnetic field in a substantially two-layer state where the polishing slurry 42 is distributed much on the substrate 1 side and the magnetic fluid 1 is distributed much on the electromagnet 6 side. By using part of this state as the polishing spot 5 for carrying out local polishing and bringing it into contact with a surface of the substrate 1, the convex portion 13 is locally polished and controlled to a flatness of several tens of nanometers.

In this MRF processing method, as different from a conventional polishing method, the polishing spot 5 is constantly flowing and thus there is no degradation of processing accuracy due to abrasion of a processing tool or a change in shape thereof and, further, it is not necessary to press the substrate 1 under high load and therefore there is an advantage in that cracks or hidden cracks in a surface displacement layer are small in number. Further, in the MRF method, the removal amount can be easily adjusted by controlling the moving speed of the substrate 1 according to a machining allowance (required processing amount) set per predetermined area, when moving the substrate 1 while keeping the polishing spot 5 in contact with the substrate 1.

As the polishing slurry 42 mixed into the magnetic fluid 41, use is made of a slurry in which fine polishing grains are dispersed in a liquid. The polishing grains are, for example, silicon carbide, aluminum oxide, diamond, cerium oxide, zirconium oxide, manganese oxide, colloidal silica, or the like and are properly selected according to a material of a workpiece, the processing surface roughness thereof, and so on. The polishing grains are dispersed into a liquid such as water, an acid solution, or an alkaline solution to form the polishing slurry 42 which is then mixed into the magnetic fluid 41.

With respect to a portion where local polishing by the MRF processing method was judged necessary as a result of carrying out fitting between a main surface of the mask blank substrate 1 and the virtual reference main surface, the local polishing was carried out by a calculated required processing amount. Then, since the main surface having been subjected to the local polishing was roughened, double-side polishing was performed only for a short time using a double-side polishing machine. The double-side polishing was performed under the following polishing conditions. The polishing conditions such as the processing pressure, the rotational speeds of upper and lower surface plates, and the polishing time were properly adjusted.

Polishing Liquid: colloidal silica (average grain size 70 nm)+alkaline aqueous solution (NaOH, pH11)

Polishing Pad: super-soft polisher (suede type)

As a result, the shape of each glass substrate was such that the main surface where a thin film for a transfer pattern was to be formed had a convex shape being relatively high at its center and relatively low at its peripheral portion. The glass substrates having a difference of 40 nm or less upon fitting to the virtual reference main surface, i.e. passed products usable as mask blank substrates of this invention, were 100 out of 100 and thus could be manufactured with an extremely high yield.

Then, a light-shielding film was formed on each of the glass substrates thus obtained in the same manner as in Example 1, thereby manufacturing mask blanks. Further, by patterning the light-shielding film of each of the mask blanks thus obtained, photomasks (binary masks) were manufactured. Like in Example 1, the obtained photomasks were set in three kinds of exposure apparatuses having different vacuum chuck structures and an inspection was conducted. The flatness was derived by a wavelength-shift interferometer using a wavelength modulation laser. As a result, in any of the exposure apparatuses, the flatness of the photomask after chucking was 0.12 μm or less and it was possible to obtain excellent transfer performance as a photomask of DRAM hp32 nm generation.

EXAMPLE 8

Like in Example 7, local processing by the MRF processing method was applied to the main surfaces of the glass substrates having been subjected to the ultra-precision polishing process and the ultrasonic cleaning in Example 2. Herein, the local processing was carried out so that the flatness of the substrate main surface in the 142 mm square area became 0.3 μm or less and, further, the flatness of the substrate main surface in the 132 mm square area became 0.2 μm or less. As a result, the shape of each glass substrate was such that the main surface where a thin film for a transfer pattern was to be formed had a convex shape being relatively high at its center and relatively low at its peripheral portion. The glass substrates having a difference of 40 nm or less upon fitting to the virtual reference main surface, i.e. passed products usable as mask blank substrates of this invention, were 100 out of 100 and thus could be manufactured with an extremely high yield.

Then, a light-shielding film was formed on each of the glass substrates thus obtained in the same manner as in Example 1, thereby manufacturing mask blanks. Further, by patterning the light-shielding film of each of the mask blanks thus obtained, photomasks (binary masks) were manufactured. Like in Example 1, the obtained photomasks were set in three kinds of exposure apparatuses having different vacuum chuck structures and an inspection was conducted. The flatness was derived by a wavelength-shift interferometer using a wavelength modulation laser. As a result, in any of the exposure apparatuses, the flatness of the photomask after chucking was 0.08 μm or less and it was possible to obtain sufficiently excellent transfer performance not only as a photomask of DRAM hp32 nm generation, but also as a photomask of DRAM hp22 nm generation.

As described above, according to this invention, a mask blank substrate is such that a main surface where a thin film for a transfer pattern is to be formed has a convex shape being relatively high at its center and relatively low at its peripheral portion and has a height difference within ±40 nm with respect to a predetermined virtual reference main surface of a virtual reference substrate. Therefore, it is not necessary to simulate the flatness of the mask substrate after chucking it on a mask stage of an exposure apparatus and, further, it is possible to realize a desired flatness thereof after chucking regardless of the chuck structure of an exposure apparatus.

This invention is not limited to the above-mentioned embodiment and can be carried out by appropriately changing it. For example, the materials, sizes, processing sequences, and so on in the above-mentioned embodiment are only examples and this invention can be carried out by changing them in various ways within a range capable of exhibiting the effect of this invention. Other than that, this invention can be carried out in various ways within a range not departing from the object of this invention.

What is claimed is:

1. A mask blank substrate for a photomask to be chucked on a mask stage of an exposure apparatus,
    wherein; with respect to the mask blank substrate,
    a difference upon fitting, to a main surface of the mask blank substrate,
    a virtual reference main surface of a virtual reference substrate in a 132 mm square area including its central portion is 40 nm or less, the main surface being on a side where a thin film for a transfer pattern is to be formed, and
    the virtual reference main surface has a convex shape being relatively high at its central portion and relatively low at its peripheral portion and has a shape specified by a complete spherical surface in the 132 mm square area.

2. The mask blank substrate according to claim 1, wherein a flatness in the 132 mm square area of the virtual reference main surface is 0.3 μm or less.

3. The mask blank substrate according to claim 2, wherein the virtual reference main surface has a radius of curvature of 14,500,000 mm or more.

4. The mask blank substrate according to claim 1, wherein the main surface of the mask blank substrate has a flatness of 0.3 μm or less in a 142 mm square area including its central portion.

5. A mask blank, comprising: the mask blank substrate according to claim 1, and a thin film formed on the main surface of the mask blank substrate.

6. A mask blank for a photomask to be chucked on a mask stage of an exposure apparatus,
    wherein; with respect to the mask blank,
    a difference upon fitting, to a main surface of the mask blank,
    a virtual reference main surface of a virtual reference substrate in a 132 mm square area including its central portion is 40 nm or less, the main surface being on a side where a thin film for a transfer pattern is to be formed, and
    the virtual reference main surface has a convex shape being relatively high at its central portion and relatively low at its peripheral portion and has a shape specified by a complete spherical surface in a 132 mm square area.

7. The mask blank according to claim 6, wherein a flatness in the 132 mm square area of the virtual reference main surface is 0.3 μm or less.

8. The mask blank according to claim 7, wherein the virtual reference main surface has a radius of curvature of 14,500,000 mm or more.

9. The mask blank according to claim 6, wherein the main surface of the mask blank has a flatness of 0.3 μm or less in a 142 mm square area including its central portion.

10. The mask blank according to claim 1 or 6, wherein the thin film is a light-shielding film made of a material containing chromium or a material containing molybdenum silicide.

11. A photomask having a transfer pattern formed by the thin film of the mask blank according to claim 5 or 6.

12. A mask blank substrate manufacturing method, comprising the steps of:
    polishing a main surface, on a side where a thin film is to be formed, of a substrate;
    measuring a surface shape of the main surface of the substrate in a 132 mm square area thereof,
    performing fitting between the measured surface shape of the substrate and a virtual reference main surface of a virtual reference substrate, and
    selecting as a mask blank substrate the substrate if a difference between the measured surface shape and the virtual reference main surface is 40 nm or less,
    wherein the virtual reference main surface has a convex shape being relatively high at its central portion and relatively low at its peripheral portion and has a shape specified by a complete spherical surface in a 132 mm square area.

13. A mask blank substrate manufacturing method according to claim 12, wherein a flatness in the 132 mm square area of the virtual reference main surface is 0.3 μm or less.

14. A mask blank substrate manufacturing method according to claim 13, wherein the virtual reference main surface has a radius of curvature of 14,500,000 mm or more.

15. A mask blank substrate manufacturing method according to claim 12, wherein the main surface of the substrate has a flatness of 0.3 μm or less in a 142 mm square area including its central portion.

16. A mask blank manufacturing method, comprising a step of: forming a thin film on the main surface of the substrate obtained by the method according to claim 12.

17. A photomask manufacturing method, comprising a step of: forming a transfer pattern in the thin film of the mask blank obtained by the method according to claim 16.

18. A semiconductor device manufacturing method using a photomask obtained by the method according to claim 17 to transfer a transfer pattern of the photomask onto a semiconductor substrate by lithography.

* * * * *